(12) United States Patent
Griffoni et al.

(10) Patent No.: US 10,098,227 B2
(45) Date of Patent: Oct. 9, 2018

(54) SUPPORT STRUCTURE FOR LIGHTING DEVICES AND CORRESPONDING METHOD

(71) Applicant: OSRAM GmbH, Munich (DE)

(72) Inventors: Alessio Griffoni, Fosso (IT); Franco Zanon, Cassola (IT)

(73) Assignee: OSRAM GmbH, Munich (DE)

( * ) Notice: Subject to any disclaimer, the term of this patent is extended or adjusted under 35 U.S.C. 154(b) by 41 days.

(21) Appl. No.: 15/093,783

(22) Filed: Apr. 8, 2016

(65) Prior Publication Data

US 2016/0302309 A1 Oct. 13, 2016

(30) Foreign Application Priority Data

Apr. 10, 2015 (IT) .......................... 102015000011417

(51) Int. Cl.
| | |
|---|---|
| *H05K 1/14* | (2006.01) |
| *H05K 1/18* | (2006.01) |
| *H05K 1/11* | (2006.01) |
| *H05K 1/02* | (2006.01) |

(52) U.S. Cl.
CPC ............ *H05K 1/142* (2013.01); *H05K 1/189* (2013.01); *H05K 1/0286* (2013.01); *H05K 1/118* (2013.01); *H05K 2201/10106* (2013.01); *H05K 2201/10363* (2013.01); *H05K 2203/0228* (2013.01)

(58) Field of Classification Search
None
See application file for complete search history.

(56) References Cited

U.S. PATENT DOCUMENTS

| | | | | | |
|---|---|---|---|---|---|
| 4,173,035 | A | * | 10/1979 | Hoyt ...................... | F21S 10/00 361/749 |
| 5,559,681 | A | * | 9/1996 | Duarte .................... | F21V 21/08 362/231 |
| 5,769,533 | A | * | 6/1998 | Yamuro .................... | F21S 4/24 362/227 |
| 5,771,003 | A | * | 6/1998 | Seymour ................ | G06K 7/065 209/571 |

(Continued)

OTHER PUBLICATIONS

Italian Search Report based on application No. 102015000011417 (2 pages) dated Jan. 14, 2016 (for reference purpose only).

*Primary Examiner* — Dimary Lopez Cruz
*Assistant Examiner* — Muhammed Azam
(74) *Attorney, Agent, or Firm* — Viering, Jentschura & Partner mbB

(57) ABSTRACT

A support structure for lighting devices, the support structure includes a ribbon-like support member with electrically conductive lines with mounting locations for electrically powered light radiation sources. The structure includes a sequence of adjacent units having opposed end regions and is severable between mutually facing end regions of adjacent units in the sequence. The units include, at the end regions, at least one electrical connection formation. The electrical connection formation includes a proximal portion electrically coupled to the electrically conductive lines of the respective unit, and a distal portion electrically insulated from the proximal portion. The distal portion is electrically coupled to the distal portion of an electrical connection formation provided in an adjacent unit to the respective unit in the sequence of adjacent units and is separable therefrom by severing the support structure.

10 Claims, 4 Drawing Sheets

(56) References Cited

U.S. PATENT DOCUMENTS

| | | | | |
|---|---|---|---|---|
| 5,931,577 A * | 8/1999 | Ishibashi | B29C 45/14073 | 362/249.04 |
| 6,323,832 B1 * | 11/2001 | Nishizawa | G09F 13/22 | 313/500 |
| 6,371,637 B1 * | 4/2002 | Atchinson | F21V 19/005 | 362/249.04 |
| 6,739,735 B2 * | 5/2004 | Talamo | E01C 17/00 | 362/153.1 |
| 7,352,339 B2 * | 4/2008 | Morgan | F24C 7/004 | 340/815.68 |
| 7,358,679 B2 * | 4/2008 | Lys | H05B 33/0815 | 315/291 |
| 7,377,669 B2 * | 5/2008 | Farmer | G09F 9/33 | 362/219 |
| 7,703,941 B2 * | 4/2010 | Lee | G09F 9/33 | 362/217.17 |
| 7,931,387 B2 * | 4/2011 | Song | F21K 9/00 | 362/235 |
| 7,938,562 B2 * | 5/2011 | Ivey | F21V 33/0052 | 362/234 |
| 8,297,788 B2 * | 10/2012 | Bishop | H05K 1/142 | 362/219 |
| 8,308,320 B2 * | 11/2012 | Tickner | F21S 4/28 | 362/217.17 |
| 8,866,396 B2 * | 10/2014 | Timmermans | H05B 33/0803 | 315/185 R |
| 9,574,717 B2 * | 2/2017 | Scapa | F21V 23/006 | |
| 9,626,884 B2 * | 4/2017 | Freeman | G09F 13/22 | |
| 2002/0114155 A1 * | 8/2002 | Katogi | F21S 2/00 | 362/219 |
| 2003/0021115 A1 * | 1/2003 | Sloan | F21S 8/032 | 362/240 |
| 2005/0068770 A1 * | 3/2005 | Sloan | F21V 33/006 | 362/227 |
| 2008/0094828 A1 * | 4/2008 | Shao | F21K 9/00 | 362/219 |
| 2009/0147504 A1 * | 6/2009 | Teeters | F21V 23/06 | 362/153 |
| 2010/0226125 A1 * | 9/2010 | Liao | F21V 19/004 | 362/235 |
| 2010/0226126 A1 * | 9/2010 | Naito | H05K 1/189 | 362/235 |
| 2013/0120979 A1 * | 5/2013 | Chen | F21V 21/005 | 362/217.17 |
| 2015/0129909 A1 * | 5/2015 | Speer | H01L 25/0753 | 257/91 |
| 2016/0302309 A1 * | 10/2016 | Griffoni | H05K 1/142 | |
| 2016/0327223 A1 * | 11/2016 | Venk | H05K 1/028 | |

\* cited by examiner

SUPPORT STRUCTURE FOR LIGHTING DEVICES AND CORRESPONDING METHOD

CROSS-REFERENCE TO RELATED APPLICATION

This application claims priority to Italian Patent Application Serial No. 102015000011417, which was filed Apr. 10, 2015, and is incorporated herein by reference in its entirety.

TECHNICAL FIELD

The present description relates to lighting devices.

One or more embodiments may be applied in lighting devices employing solid-state light radiation sources, such as LED sources.

BACKGROUND

In the field of the lighting technology, linear LED modules are increasingly used having e.g. the following features:
- the ability to flex, offering the user the possibility of employing the product in several application scenarios. This may be achieved for example by using Flexible Printed Circuits (FPCs), which are adapted to withstand bending stresses;
- electrical continuity, which enables the manufacturing of elongated LED modules having one or more units;
- safety and reliability features against electrical stresses (e.g. lighting surges), which may be achieved if the module has a certain insulation distance, e.g. in terms of creepage and clearance distance (CR&CL), depending on the Electronic Control Gear (ECG) and the required robustness level towards (over)stresses and electrical safety;
- availability in reels, enabling luminaire makers to employ them in automatic processes;
- possibility of a cut to length, e.g. at fixed lengths.

The fulfilment of one or more such requirements at the same time may be challenging.

Currently implemented solutions consist in keeping the creepage and clearance distance along the sides of the flexible module, by applying safety caps to the ends (i.e. to the "short" sides) of the modules. In this way, an electrical continuity between two consecutive units may be ensured by conductive (e.g. copper) tracks provided therein, while avoiding interruptions from one unit to the other. This leads to obtaining LED strips which may be cut, a disadvantage however consisting in the need of further manufacturing processes to be performed on the luminaire maker's side.

Another implementation may envisage the use of an insulating tape below the flexible module, so that the latter may be designed without specifically taking into account creepage and clearance distances. The electric continuity between two consecutive units may be provided by the conductive tracks, since interruptions are not present in this case either. This solution leads to obtaining a LED strip which is adapted to be cut, but again which requires additional productive processes and thermal performances.

SUMMARY

In various aspects of this disclosure, a support structure for lighting devices is provided. The support structure includes a ribbon-like support member with electrically conductive lines with mounting locations for electrically powered light radiation sources. The structure includes a sequence of adjacent units having opposed end regions and is severable between mutually facing end regions of adjacent units in the sequence. The units include, at the end regions, at least one electrical connection formation. The electrical connection formation includes a proximal portion electrically coupled to the electrically conductive lines of the respective unit, and a distal portion electrically insulated from the proximal portion. The distal portion is electrically coupled to the distal portion of an electrical connection formation provided in an adjacent unit to the respective unit in the sequence of adjacent units and is separable therefrom by severing the support structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

In the following description, numerous specific details are given to provide a thorough understanding of one or more embodiments. The embodiments may be practiced without one or several specific details, or with other methods, components, materials, etc. In other instances, well-known structures, materials or operations are not shown or described in detail to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments, and/or may be associated to the embodiments in a different way from what is shown herein, so that e.g. a feature herein exemplified in connection to a Figure may be applied to one or more embodiments exemplified in a different Figure.

The headings provided herein are for convenience only, and therefore do not interpret the extent of protection or meaning of the embodiments.

Figure 1:
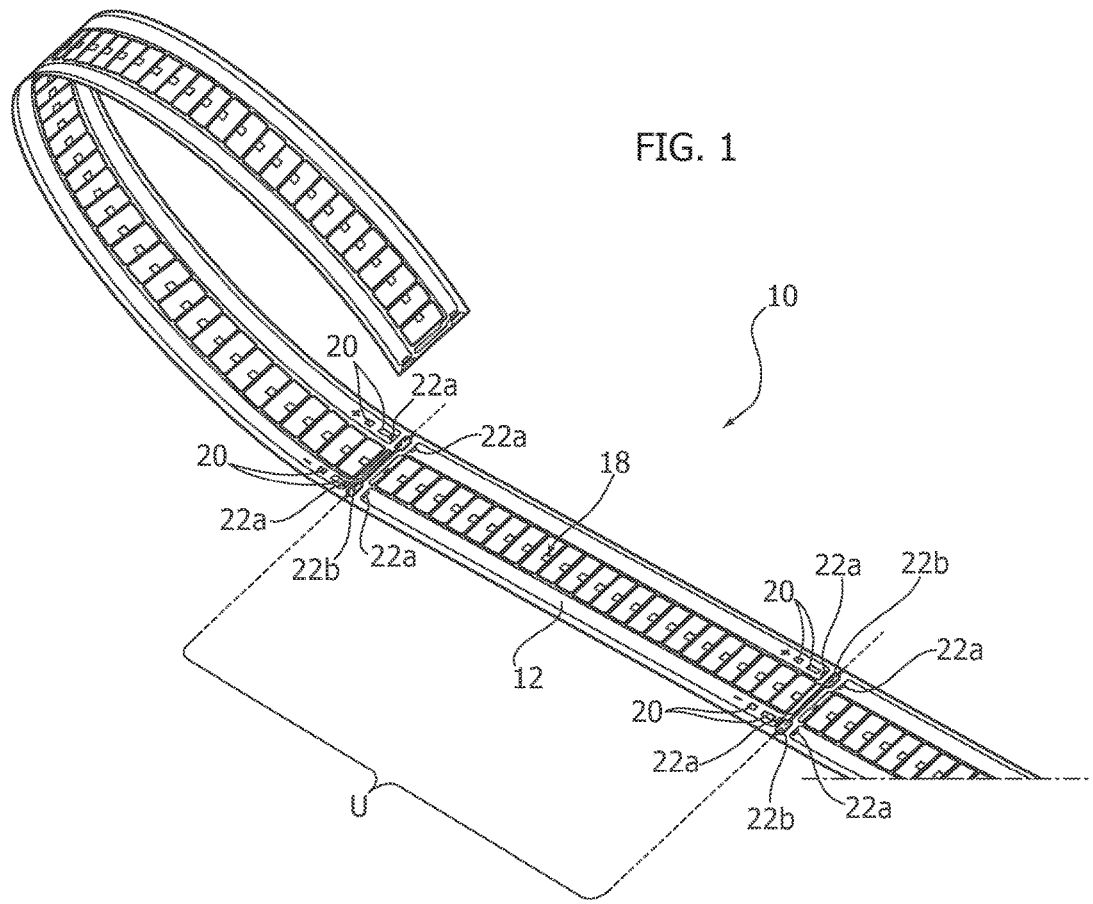
FIG. 1 shows a general perspective view of a support structure according to one or more embodiments.

In FIG. 1 reference 10 denotes on the whole a support structure which may be employed in lighting devices.

In one or more embodiments, the lighting device may employ solid-state radiation sources, such as for example LED (light emitting diode) sources, some of which are denoted with reference L in Figures such as FIG. 2 or FIG. 7 to FIG. 9. The diagram of FIG. 10 shows an electrical circuit of such a device, including a plurality of such light radiation sources $LED_{1-1-1}$-$LED_{1-1-12}$; $LED_{1-2-1}$-$LED_{1-2-12}$, ... $LED_{3-2-1}$-$LED_{3-2-12}$.

In one or more embodiments, support structure 10 (which, as can be seen in FIG. 1, may be wound as a reel) may include a ribbon-like support element 12, e.g. of an insulating material (e.g. a resin such as polyamide or polyethylene terephtalate resin) on which electrically conductive lines 14 are formed (e.g. of a metal material as copper).

Figure 3:
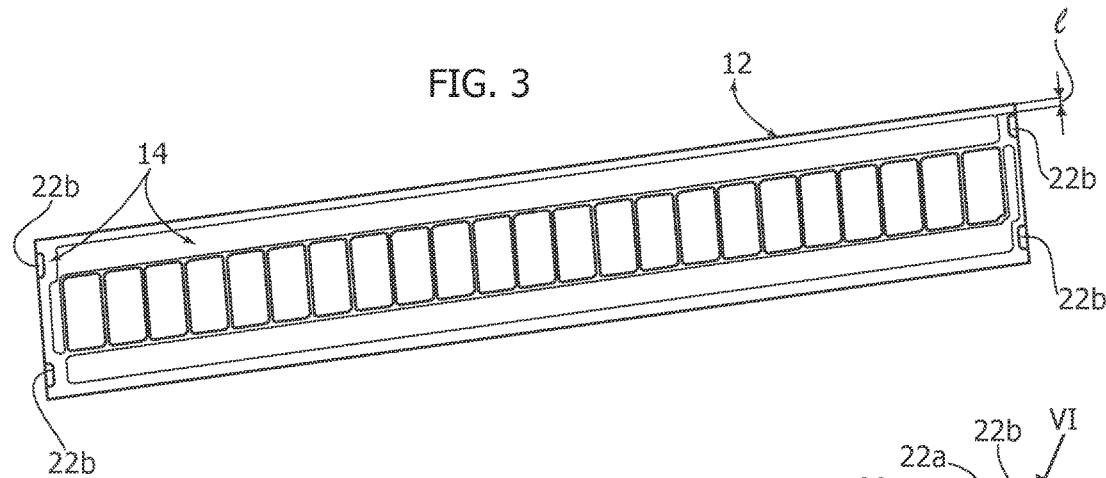
FIGS. 3 and 4 show possible implementation examples of one or more embodiments.
Figure 4:
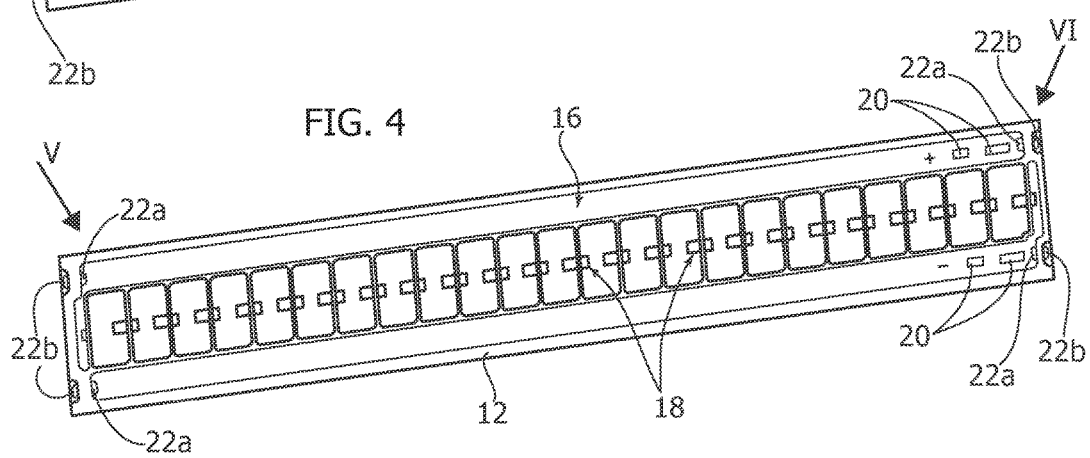

In one or more embodiments, lines 14 may be formed on support element or substrate 12 via various known techniques, and may be coated with a protective material (e.g. a so-called solder resist) 16, see e.g. FIG. 3 and FIG. 4, so as to leave various electrically conductive land areas or pads exposed.

In one or various embodiments there may be provided e.g. pads 18 (which are currently named LED land patterns) which are adapted to define respective mounting locations for light radiation sources L.

In addition to mounting locations 18 for sources L, there may be provided further electrical contact areas, such as further land patterns 20 for the coupling of power supply connectors, as well as further electrical connection formations 22a, 22b.

The latter will be further described in the following: in FIG. 3, however, land pads or formations 22b are shown as electrically insulated from land pads 22a.

In one or more embodiments, electrically conductive lines 14 may be designed so that, on both longitudinal sides of structure 10, they are in any case located at a distance 1 from the longitudinal sides of support element 12 (see especially FIG. 4), in such a way as to ensure a creepage and clearance distance (CR&CL).

In a corresponding way, both portions 22a and 22b (which, in one or more embodiments as exemplified in the Figures, are provided on both sides of structure 10) are electrically insulated one from the other and are separated by a distance (denoted as d in FIG. 6, FIG. 7 and FIG. 9) which is selected in such a way as to create a creepage and clearance distance, ensuring therefore an insulation level which meets the requirements of electrical safety and robustness against electrical (over)stresses.

Figure 2:
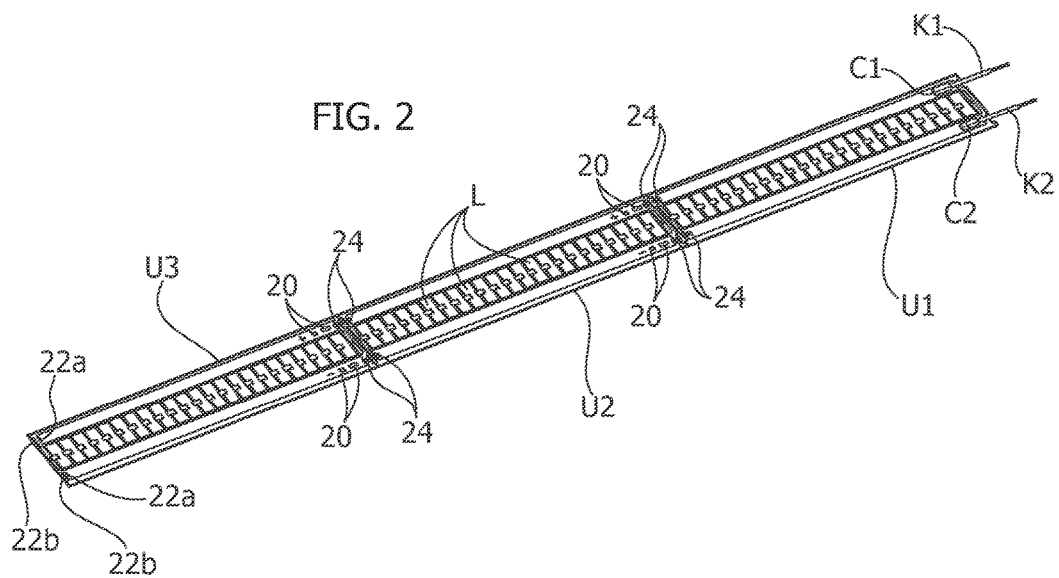
FIG. 2 shows exemplifies a lighting device which may be implemented according to one or several embodiments.

As can be seen e.g. in the views of FIG. 1 and FIG. 2, structure 10 may be considered as consisting in a sequence of units U adjacent to one another (i.e. one after the other or in a cascade succession) along the length of structure 10.

Even if structure 10 may be considered as a single structure, all the units being (still) connected to one another, each unit clearly shows two opposing end regions, at which electrical connection formations 22a, 22b are located.

FIG. 2 shows three units U, respectively denoted as U1, U2, U3, which have been separated from a support structure 10 but which are kept mutually connected—as better detailed in the following—so as to obtain a lighting device by the arrangement of light radiation sources L.

Such a lighting device may include any number of such units; in one or more embodiments, each unit (see for instance unit denoted as U in FIG. 1) may be separated from structure 10 by severing structure 10 at the mutually facing end regions of two subsequent units, i.e. by severing the ribbon-like structure 10 at an intermediate position between two mutually facing ends of two adjacent units U, as shown by dotted lines in FIG. 1.

As exemplified in FIG. 1, in one or more embodiments such severing operation may be performed for example by cutting in half one of the electrically conductive pads denoted as 22b, so that the severing operation divides such pads into two portions 22b, which previously constituted one piece.

Such a severing operation, which is performed in an intermediate position between two adjacent units U, is easily achieved because, in addition to the material of support element 12 (which is usually a thin and flexible plastic material, and therefore easy to cut) it concerns only the pads of a conductive material (e.g. a thin metal layer) corresponding to electrically conductive portions 22b.

Figure 5:
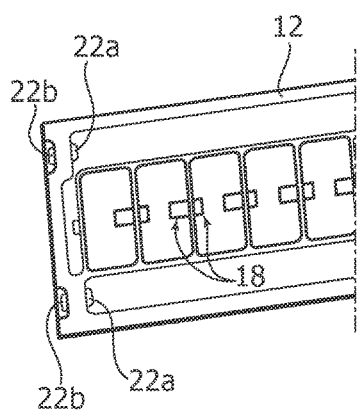
FIGS. 5 and 6 show details of FIG. 4 according to viewpoints which approximately correspond to arrow V and, respectively, to arrow VI of FIG. 4.
Figure 6:
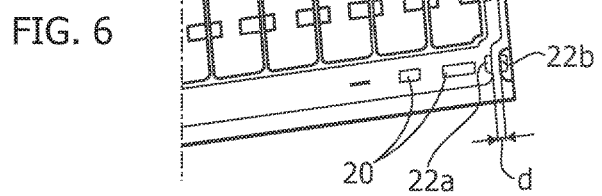

As can be seen, e.g. in FIG. 4 to FIG. 6, a severing operation performed in order to separate from structure 10 a unit U or a series of units U1, U2, U3 leads to the formation, at each of the opposing end regions of such a unit U or series of units (for simplicity, FIG. 3 to FIG. 6 exemplify the case of a single unit), of one or more connection formations (in the illustrated examples, a pair of such formations is shown, each being arranged on one side of structure 10), each formation including:

a proximal portion 22a, electrically coupled to the electrically conductive lines provided in the respective unit U (i.e. the unit which includes portion 22a), and a distal portion 22b, electrically insulated from said proximal portion 22a and therefore insulated from the electrically conductive lines provided on respective unit U.

It will be appreciated that, before cutting structure 10, distal portion 22b was on the contrary electrically coupled (e.g. by consisting of a single pad of electrically conductive material, which has been divided into two portions by cutting) to a corresponding proximal portion 22b provided on a unit adjacent to the unit where said distal portion 22b is located.

Of course, the terms "proximal" and "distal" herein are to be understood as referring to the relative position which both portions 22a and 22b take within unit U which accommodates them.

Figure 7:
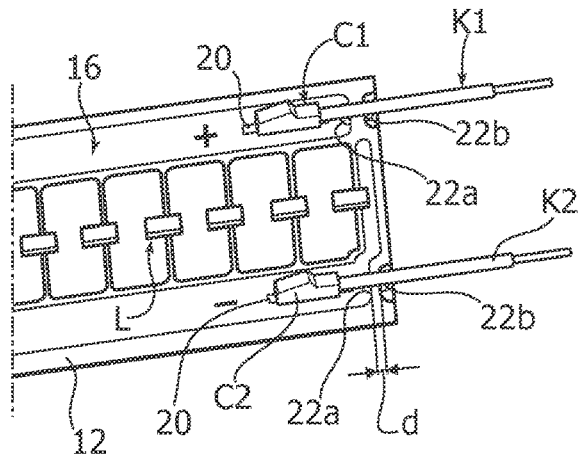
FIGS. 7 to 9 show possible applications of embodiments.

FIG. 7 shows the possibility of using locations or contact pads 20 to couple (e.g. via gluing or soldering) respective connectors C1, C2 connected to cables K1, K2 adapted to perform power supply, respectively as a cathode and an anode, of a respective unit U.

Figure 8:
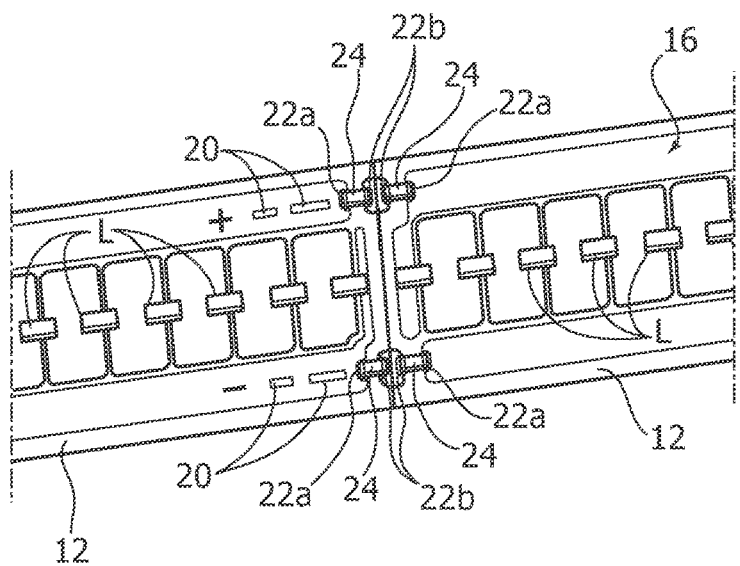

FIG. 8 exemplifies how, in one or more embodiments, power supply portions 22a, 22b may be used to transfer power from a certain unit, which receives power through cables K1, K2 and connectors C1, C2, to ad adjacent unit which, after cutting structure 10, has maintained the connection to the unit whereon power supply is applied.

As already stated, the mutually facing end regions of two adjacent units U in structure 10 are mechanically connected to each other not only by ribbon-like support 12 but also via respective portions 22b of the electrical connection formations.

Until they are separated by severing structure 10, such mutually facing portions 22b of two different units U are physically connected to each other and provide, in addition to the mechanical connection between two adjacent units, an electrical connection therebetween.

Such electrical connection, however, does not extend to the electrically conductive lines which are provided on the respective units, since portions 22b are electrically insulated (by the creepage and clearance distance d) from the respective proximal portions 22a provided on both adjacent units.

The electrical connection between the electrical conductive lines on two adjacent units (which enables the transfer of power supply from the unit (e.g. U1) receiving the supply from outside, see e.g. C1, C2, K1, K2 in FIG. 7, to the other units, e.g. U2 and U3, may however be implemented by bridge-like structures, such as e.g. so-called 0-Ohm SMD resistors, each of which provides the electrical connection between one of distal portions 22b and the corresponding proximal portion 22a.

The possibility is therefore given to implement, e.g., a circuit diagram as shown in FIG. 10, which may be seen as corresponding to the lighting device including three units U1, U2 and U3.

In one or more embodiments, the portions of the electrically conductive lines corresponding to portions 22b may extend between two adjacent units U by keeping the features of a high mechanical flexibility of the module including structure 10, while avoiding the presence of local areas having a higher rigidity, which might on one hand affect the flexibility of the module on the whole and on the other hand create areas subjected to higher loads.

In the circuit diagram of FIG. 10, the resistors shown as $R_{i-j-U/L}$ may be 0-Ohm resistors, wherein i is the i-th unit (e.g. U1, U2, U3 . . . ), index j stands for the j-th LED string in the unit and letters U or L may indicate the application either on the upper or on the lower side of flexible ribbon-like support element 12.

Figure 9:
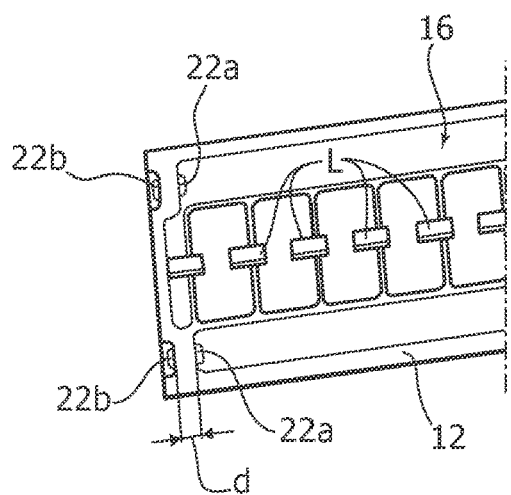
Figure 10:
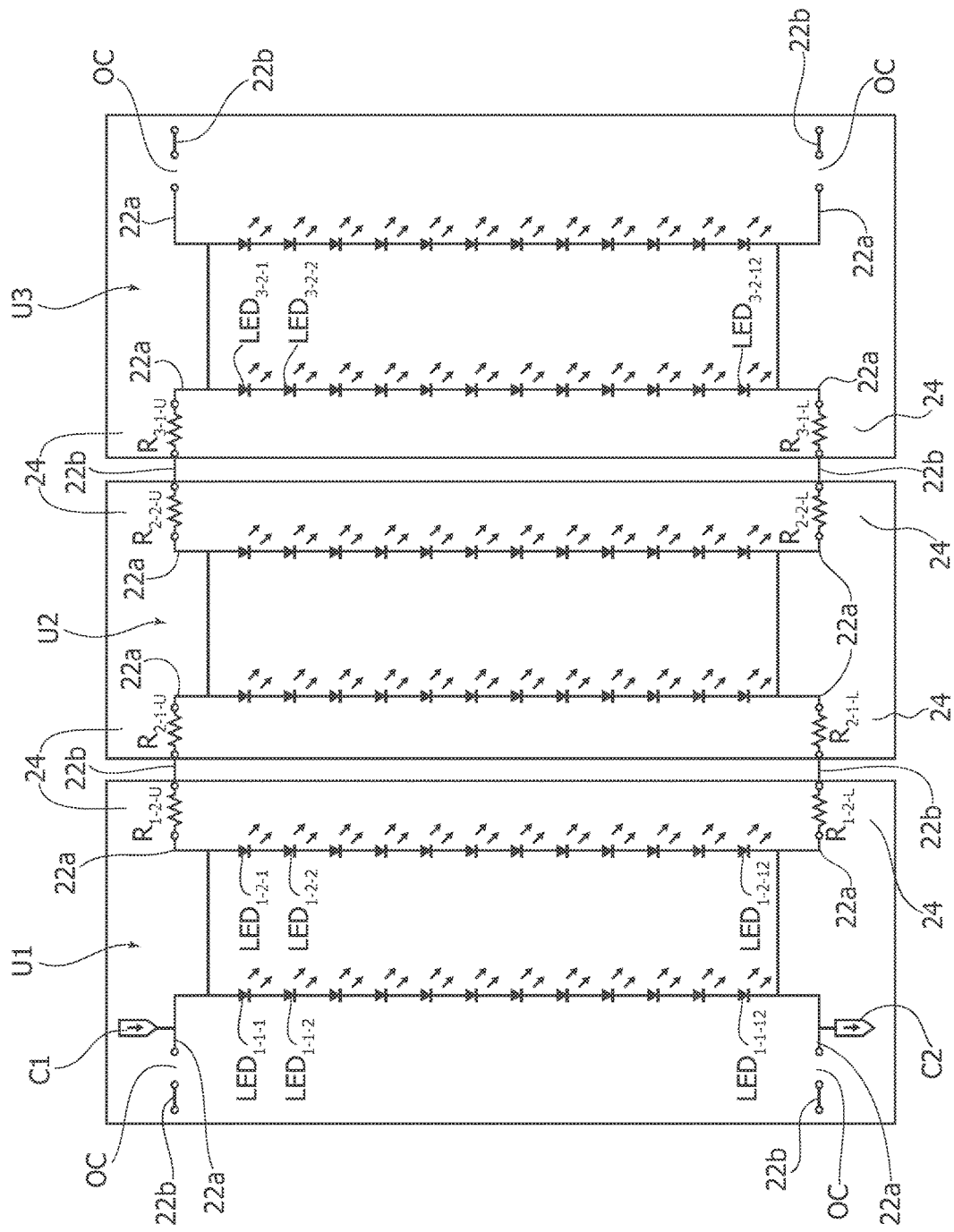
FIG. 10 shows a circuit diagram which can be implemented according to one or more embodiments.

A comparative observation, e.g., of FIG. 2 and of the corresponding circuit diagram of FIG. 10 makes it clear that, since they are not to be populated with components (e.g. SMD components), portions 22a, 22b located at the end regions of the lighting device (including one or more units U, e.g. the three units U1, U2, U3) constitute open circuits (OCs) which are adapted to keep the creepage and clearance distance (d, see for example FIG. 6, FIG. 7 and FIG. 9).

It will be appreciated, therefore, that a support structure according to one or more embodiments may be used, e.g., by separating at least one or more units U (e.g. three units U1, U2 and U3) from support structure 10, by severing the structure at at least one location between mutually facing end regions of adjacent units U.

The reference to at least one severing location takes into account the fact that said unit(s) may be severed from structure 10 by cutting structure 10 itself:
at one single location along the length thereof, if the severed unit(s) are at an end position of structure 10 (for example a free end of a reel, as visible in FIG. 1) so that one single cut is sufficient to separate them from structure 10, or
at two locations along the length thereof, if the severed unit(s) are at an intermediate position within structure 10, so that the separation requires severing the structure upstream and downstream the unit(s) U being severed.

In one or more embodiments, moreover, it is possible to couple a power supply line K1, K2; C1, C2 to the electrically conductive lines of the at least one unit severed from said support structure 10.

In one or more embodiments, wherein the severing operation of support structure 10 (at least one cutting location in this case as well) is performed in such a way as to separate from structure 10 a plurality of adjacent units (e.g. U1, U2, U3 in FIG. 2) which are coupled to each other in respective mutually facing end regions, it is possible to provide electrically conductive bridge members 24 between proximal portion 22a and distal portion 22b of the electrical connection formations provided in said respective mutually facing end regions of said plurality of adjacent units, separated by support structure 10; in this way, the electrically conductive lines provided in said plurality of adjacent units, separated by support structure 10, may be electrically coupled to one another.

One or more embodiments aim at offering solutions implementing linear modules which are electrically continuous, electrically safe, robust against electrical overstress events, adapted to be cut at length and mechanically flexible.

According to one or more embodiments, a support structure is provided having the features specifically set forth in the claims that follow.

One or more embodiments may also relate to a corresponding method.

The claims are an integral part of the technical teaching provided herein with reference to the embodiments.

One or more embodiments may envisage the use of bridge circuits, so as to implement linear modules which are electrically continuous, electrically safe, robust against electrical overstress events, adapted to be cut at length and mechanically flexible.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A support structure for lighting devices, the support structure comprising:
    a flexible ribbon-like support member with electrically conductive lines with mounting locations for electrically powered light radiation sources, the structure comprising a sequence of adjacent units having opposed end regions and being severable between mutually facing end regions of adjacent units in the sequence;
    wherein the units include, at the end regions, at least one electrical connection formation with electrical contact areas formed on the flexible ribbon-like support member, and the at least one electrical connection formation comprising:
        a proximal portion electrically coupled to the electrically conductive lines of the respective unit; and
        a distal portion electrically insulated from the proximal portion, wherein the distal portion is electrically coupled to the distal portion of an electrical connection formation provided in an adjacent unit to the respective unit in the sequence of adjacent units and is separable therefrom by severing the support structure.

2. The support structure of claim 1,
    wherein the distal portion is one piece with the distal portion of an electrical connection formation provided in an adjacent unit to the respective unit in the sequence of adjacent units.

3. The support structure of claim 1,
    wherein the proximal portion and the distal portion are at a distance providing electrical creepage and clearance distance therebetween.

4. The support structure of claim 1,
    wherein the units in the sequence of adjacent units include, at the end regions, a pair of electrical connection formations each including one of the proximal portion and one of the distal portion.

5. The support structure of claim 1,
wherein the proximal portion and the distal portion are connectable via an electrically conductive bridge member therebetween.

6. The support structure of claim 1,
wherein the support member is flexible.

7. A method, comprising:
severing a support structure at least one location between mutually facing end regions of adjacent units in the sequence of adjacent units by separating from the support structure at least one unit in the sequence of adjacent units, wherein the support structure comprises
a flexible ribbon-like support member with electrically conductive lines with mounting locations for electrically powered light radiation sources, the structure comprising a sequence of adjacent units having opposed end regions and being severable between mutually facing end regions of adjacent units in the sequence;
wherein the units include, at the end regions, at least one electrical connection formation with electrical contact areas formed on the flexible ribbon-like support member, and the at least one electrical connection formation comprising:
a proximal portion electrically coupled to the electrically conductive lines of the respective unit; and
a distal portion electrically insulated from the proximal portion, wherein the distal portion is electrically coupled to the distal portion of an electrical connection formation provided in an adjacent unit to the respective unit in the sequence of adjacent units and is separable therefrom by severing the support structure;
coupling an electrical power feed line to the electrically conductive lines provided in the at least one unit separated from the support structure.

8. The method of claim 7, further comprising:
severing the support structure at least one location between mutually facing end regions of adjacent units in the sequence of adjacent units by separating from the support structure a plurality of units in the sequence of adjacent units coupled to one another at respective, mutually facing end regions; and
arranging electrically conductive bridge members between the proximal and distal portions of the electrical formations provided at the respective, mutually facing end regions of the plurality of units separated from the support structure, thereby electrically coupling the electrically conductive lines provided in the plurality of units separated from the support structure.

9. The method of claim 7, further comprising:
arranging electrically powered light radiation sources at the mounting locations.

10. A lighting device comprising:
a support structure, the support structure comprising:
a flexible ribbon-like support member with electrically conductive lines with mounting locations for electrically powered light radiation sources, the structure comprising a sequence of adjacent units having opposed end regions and being severable between mutually facing end regions of adjacent units in the sequence;
wherein the units include, at the end regions, at least one electrical connection formation with electrical contact areas formed on the flexible ribbon-like support member, and the at least one electrical connection formation comprising:
a proximal portion electrically coupled to the electrically conductive lines of the respective unit; and
a distal portion electrically insulated from the proximal portion, wherein the distal portion is electrically coupled to the distal portion of an electrical connection formation provided in an adjacent unit to the respective unit in the sequence of adjacent units and is separable therefrom by severing the support structure
a plurality of light radiation sources mounted on said mounting locations; and
electrically conductive bridge members connecting said proximal portions to said distal portions of the electrical connection formations in at least one mutually facing end region of the plurality of adjacent units.

* * * * *